US006511546B1

(12) United States Patent
Bivins et al.

(10) Patent No.: US 6,511,546 B1
(45) Date of Patent: Jan. 28, 2003

(54) AQUEOUS CLEANING

(75) Inventors: Elizabeth A. Bivins, Jacksonville, FL (US); Nelson E. Prieto, Jacksonville, FL (US); Michael E. Hayes, Fernandina Beach, FL (US); Byron A. Starkweather, Jacksonville, FL (US)

(73) Assignee: Petroferm Inc., Fernandina Beach, FL (US)

( * ) Notice: Subject to any disclaimer, the term of this patent is extended or adjusted under 35 U.S.C. 154(b) by 0 days.

(21) Appl. No.: 09/449,305

(22) Filed: Nov. 24, 1999

Related U.S. Application Data

(60) Provisional application No. 60/110,031, filed on Nov. 25, 1998.

(51) Int. Cl.$^7$ .................................................. C23G 1/00
(52) U.S. Cl. ..................... 134/2; 134/2; 134/7; 134/40; 134/42
(58) Field of Search ................ 134/2, 40, 42, 134/7

(56) References Cited

U.S. PATENT DOCUMENTS

| | | | |
|---|---|---|---|
| 3,779,927 A | 12/1973 | Howell et al. ................. 252/75 |
| 3,886,099 A | 5/1975 | Hall .......................... 252/458 |
| 4,278,557 A | 7/1981 | Elwell, Jr. ................... 252/171 |
| 4,294,729 A | 10/1981 | Bakos et al. ................. 252/545 |
| 4,740,247 A | 4/1988 | Hayes et al. .................. 134/42 |
| 4,863,525 A | 9/1989 | Goel et al. .................... 134/22 |
| 4,867,800 A | 9/1989 | Dishart et al. ................. 134/40 |
| 5,096,504 A | 3/1992 | Chihara et al. ................ 134/42 |
| 5,120,371 A | 6/1992 | Bolden et al. ................. 134/40 |
| 5,234,506 A * | 8/1993 | Winston et al. ............... 134/40 |
| 5,256,209 A | 10/1993 | Chihara et al. ................ 134/38 |
| 5,264,046 A | 11/1993 | Winston et al. ............... 134/42 |
| 5,296,041 A | 3/1994 | Vinci et al. .................... 134/40 |
| 5,330,582 A | 7/1994 | Chihara et al. ................ 134/40 |
| 5,340,407 A | 8/1994 | Bolden et al. ................. 134/26 |
| 5,350,457 A | 9/1994 | Kitazawa et al. .............. 134/10 |
| 5,378,386 A | 1/1995 | Short et al. ................... 252/162 |
| 5,393,448 A | 2/1995 | Winston et al. .............. 252/109 |
| 5,482,645 A | 1/1996 | Maruyama et al. ......... 252/170 |
| 5,486,314 A | 1/1996 | Wack et al. .................. 252/542 |
| 5,522,940 A | 6/1996 | Kitazawa et al. .............. 134/10 |
| 5,549,761 A * | 8/1996 | Winston et al. ............... 134/40 |
| 5,558,109 A | 9/1996 | Cala et al. ..................... 134/42 |
| 5,593,504 A | 1/1997 | Cala et al. ..................... 134/1 |
| 5,688,753 A | 11/1997 | Cala et al. ................... 510/175 |
| 5,733,378 A | 3/1998 | Berbel ......................... 134/10 |
| 5,755,893 A | 5/1998 | Cala et al. ..................... 134/2 |
| 5,772,789 A * | 6/1998 | Eichhorn et al. .............. 134/40 |
| 5,814,588 A | 9/1998 | Cala et al. ................... 510/175 |
| 5,821,208 A | 10/1998 | Cala et al. ................... 510/175 |
| 5,846,920 A | 12/1998 | Shiino et al. ................ 510/175 |
| 5,849,106 A | 12/1998 | Bolden et al. ................. 134/40 |
| 5,922,665 A | 7/1999 | Liu ............................. 510/365 |
| 5,932,021 A * | 8/1999 | Cala et al. ..................... 134/2 |

FOREIGN PATENT DOCUMENTS

WO    WO 97/32963    9/1997

* cited by examiner

Primary Examiner—Randy Gulakowski
Assistant Examiner—Gentle E. Winter
(74) Attorney, Agent, or Firm—Synnestvedt & Lechner LLP

(57) ABSTRACT

A process for the use of an aqueous cleaning composition to remove organic material from a substrate. The cleaning composition preferably includes a nonionic surfactant and may also include a glycol ether solvent.

18 Claims, No Drawings

AQUEOUS CLEANING

CROSS-REFERENCE TO RELATED APPLICATION

This application claims the benefit of U.S. Provisional Application No. 60/110,031, filed Nov. 25, 1998.

FIELD OF THE INVENTION

This invention relates to an aqueous cleaning composition and a process for the use of such composition in removing organic material from a substrate. This invention will be described initially in connection with cleaning electronic parts whose surfaces are soiled with an organic residue, for example, raw solder pastes and uncured epoxy-based surface-mount adhesives that are present on the surfaces of circuit boards and stencils as a result of the assembly process. It should be understood, however, that the invention has broader applicability, as explained below.

In electronics assembly, soldering is a process for forming a metallurgical bond between components and a printed circuit board to make an electronic circuit. This is done by contacting the board and components with molten solder. The solder connection is formed when the solder solidifies upon cooling. Solder flux is used to remove oxides from the surfaces so that the solder may wet effectively. Solder paste is a viscous combination of flux paste and dry solder particles which are approximately spherical in shape. The solder paste is a substantially stable composition that can be dispensed through an orifice or printed through a stencil. Solder paste is used for soldering surface-mount components, that is, those that are soldered directly onto the surface of a printed circuit board. Surface-mount adhesives are used frequently to hold surface-mount components in place prior to soldering. These adhesives are based usually on silicone, epoxy, urethane, or acrylic chemistry, with epoxy being the most common. Epoxies used for electronics assembly are typically curable compositions comprising a bisphenol A epoxy resin, an aliphatic polyol epoxy resin, a modified amine, fillers, and additives.

Solder paste and/or epoxy surface mount-adhesive is applied to circuit boards by stenciling or dispensing the paste or the adhesive through a small nozzle prior to placement of electronic components onto the boards. Periodically, there will be a "misprint," that is, a board onto which the paste or adhesive was not dispensed in the proper location. In such cases, it is more economical to clean the board and reuse it rather than dispose of it. It is also necessary to clean the stencils after several printings to keep the apertures free from soil to avoid future aperture clogging, misprints, and consequent reliability problems with the completed circuit assembly.

Desirable cleaning compositions, in addition to being environmentally benign, should be safe to the user. Accordingly, they should be nonflammable under the conditions of use and be non-toxic or have low toxicity, among other attributes well known in the art. Desirable cleaning compositions should be effective also in removing contaminants from the substrates without damaging the substrates or the materials of construction of the equipment in which the composition is being used.

The present invention relates to a cleaning composition which is effective in removing organic residues from substrates which are soiled therewith, particularly surfaces of electronic parts which are soiled with organic-based adhesives and solder paste.

REPORTED DEVELOPMENTS

Prior-art cleaning compositions to clean solder paste and surface-mount adhesive residues often comprise ozone-depleting solvents and high levels of volatile organic compounds (VOCs) and are either flammable or combustible.

Presently in the electronics industry, there is a movement toward the use of cleaning compositions with favorable environmental properties, specifically those with low concentrations of volatile organic compounds (VOCs). Traditionally, the industry has relied heavily on the use of cleaning compositions which are now considered as having unfavorable environmental properties such as high ozone-depletion potentials or high global-warming potentials. Examples of such compositions are 1,1,2-trichlorotrifluoroethane (CFC-113) and 1,1,1-trichloroethane.

Because of their undesirable properties, the aforementioned compositions have been replaced with high vapor-pressure solvents. Examples of such solvents are isopropyl alcohol and aliphatic hydrocarbons, such as, for example, mineral spirits. Such solvents are now considered unfavorable because they have high concentrations of VOCs, which contribute to ground-level ozone formation. At present, the standards established by the State of California are generally regarded as the most stringent in the United States and, therefore, are considered a guide for industry. Under California law, the present standard requires compositions to have a VOC content of less than 50 g/l.

Aqueous cleaning compositions for removing solder paste from stencils are presently known in the industry. For cleaning raw solder pastes, a solvent or water-based detergent or inorganic saponifier, that is, a product with alkaline components and a pH greater than 10, are cleaners of choice. For example, U.S. Pat. No. 5,593,504 to Cala et al. discloses an aqueous alkaline cleaner comprising alkaline salts such as alkali metal carbonates, a surfactant formulation which contains at least one nonionic surfactant, an alkali metal silicate corrosion inhibitor, and stabilizers to maintain the components in aqueous solution.

A commercially available cleaning composition marketed by Smart Sonic Corporation under the name 440-R SMT Detergent is a proprietary highly alkaline cleaner which has a pH of over 12 at its recommended concentrations for cleaning solder pastes and surface mount device (SMD) adhesives.

These and similar cleaners have a variety of shortcomings. First, because they are alkaline and have a pH greater than about 8, the spent material must be neutralized with acid prior to disposal. Furthermore, such alkaline cleaners can be used to clean solder pastes, but not surface-mount adhesives because the water will initiate prematurely the epoxy curing mechanism, as discussed below. Accordingly, it would be necessary for electronics manufacturers who are required to remove not only solder paste, but also surface-mount adhesives, to use multiple cleaning chemistries. Alkaline cleaners may also attack certain metals on circuit boards, components, or stencils.

For cleaning uncured epoxies, water-based products are not used usually because exposure to water tends to cause the epoxy to cure prematurely. Non-hygroscopic solvents such as propylene glycol ethers, aliphatic hydrocarbons, or d-limonene are preferred cleaning solvents. If the epoxy cures on the stencil or misprinted board, it is extremely difficult to remove and would require an aggressive cleaner like that disclosed in U.S. Pat. No. 4,729,797 to Linde et al. The composition described in this patent contains pyridine or substituted pyridines either alone or combined with dimethylsulfoxide (DMSO). Cured epoxy is removed by placing the soiled substrate in a boiling solution (refluxing in a distillation apparatus) of the aforementioned composition. Pyridine is a dangerous chemical with a very low 8-hour exposure threshold limit value of 5 parts per million established by the American Conference of Governmental Industrial Hygienists (ACGIH).

The present invention relates to a cleaning composition which overcomes the disadvantages associated with the use of prior art cleaning compositions, for example, as described above.

SUMMARY OF THE INVENTION

In accordance with the present invention, there is provided a process for cleaning a substrate having thereon a residue which includes a curable organic material. The process comprises contacting the substrate with an aqueous cleaning composition which removes the curable organic material from the substrate while inhibiting the material from curing prior to its removal. The process is particularly suitable for removing uncured surface-mount adhesives, including, for example, epoxy-based materials, and solder paste from electronic components and manufacturing apparatus.

A preferred cleaning composition for use in the present invention is one comprising water, preferably deionized water, and a surfactant which is at least partially soluble in the water, preferably a nonionic surfactant. For purposes of this application, "partially soluble surfactants" are those which may not dissolve completely in water at room temperature, but which can be fully dissolved or dispersed in water by heating to a desired operating temperature or by the addition of a second surfactant. Good results are obtained using a composition which comprises from about 50 to about 95 wt. % deionized water and from about 5 to about 50 wt. % soluble nonionic surfactant.

Preferably, also, the cleaning composition is of low alkalinity, with a pH below about 10, more preferably below about 8, and most preferably about 7.

In accordance with another preferred embodiment of the present invention, the cleaning composition may comprise an aqueous mixture of a surfactant, preferably a nonionic surfactant, and at least one glycol ether compound of the general formula

wherein $R^1$ is a hydrogen atom or an alkyl group having 1 to about 5 carbon atoms, $R^2$ is an alkyl group having 1 to about 5 carbon atoms, $R^3$ is a hydrogen atom or a methyl group, and n is an integer of 2 to 4. Such glycol ether compounds are discussed in U.S. Pat. No. 5,330,582, the disclosure of which is incorporated herein by reference. Preferred glycol ether compounds of this formula for use in the present cleaning composition are propylene glycol alkyl ethers, particularly dipropylene glycol alkyl ethers, and more particularly dipropylene glycol n-butyl ether.

Such glycol ethers generally are considered volatile organic compounds (VOCs). As discussed above, preferably the cleaning compositions have a VOC content which is acceptable in accordance with applicable environmental regulations. At present, in accordance with California regulations, it is preferred that the VOC content of the composition is less than about 50 g/l at concentrations for normal use. Preferably the amount of the glycol ether component used in the composition relatively small to provide as low a VOC content as possible. More preferably, the cleaning composition is substantially free of VOCs.

DETAILED DESCRIPTION OF THE INVENTION

The process of the present invention is particularly suitable for cleaning a substrate having thereon a residue which includes a water-curable organic material. The process comprises contacting the substrate with an aqueous cleaning composition which removes the curable material from the substrate before it is able to cure and thereby become difficult to remove. This process is particularly suitable for cleaning the surfaces of electronic parts, and apparatus for manufacturing such parts, of organic residue. For example, the process of the present invention can be used to remove both raw solder pastes and uncured surface-mount adhesives, including uncured epoxy adhesives, from circuit boards, stencils, and other items in the electronics assembly process that require removal of these contaminants. A preferred composition useful in the process is substantially free of any materials with an ozone depletion potential of greater than about 0.1, and free of any materials that make the VOC content of the entire composition in use greater than about 50 grams per liter.

A preferred embodiment of the process of the present invention utilizes a composition which comprises water and a water-soluble or partially water-soluble surfactant, more preferably a nonionic surfactant. Preferably the surfactant compound is one which has hydrophilic and lipophilic components. Such compounds are often characterized by a hydrophilic-lipophilic balance (HLB) value, which ranges from 0 (purely lipophilic) to 20 (purely hydrophilic). The method of determining HLB values varies with the type of surfactant being evaluated. Nevertheless, HLB values provide a useful measure of the comparative hydrophilic and lipophilic nature of such compounds. Preferred surfactants are ones which are more hydrophilic, with an HLB value greater than 10. Particularly preferred are surfactants having HLB values from about 10 to about 17. To ensure purity and for best cleaning, preferably, the water used in the cleaning composition is deionized water.

Many types of nonionic surfactants are suitable for use in the present invention. A key requirement is that the aqueous surfactant cleaning solution is capable of removing the targeted impurities from electronic parts. In particular, the cleaning solution needs to be able to remove uncured adhesives, such as epoxy adhesives, from such parts without causing the adhesive to cure and become unremovable. The following types of non-ionic surfactants are particularly suitable for use in the process of the present invention.

A) Block copolymers of ethylene oxide (EO) and propylene oxide (PO) of the general form (1) EO-PO-EO or (2) PO-EO-PO, which may be represented structurally as:

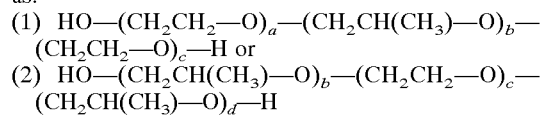

wherein each of a, b, c and d is between 0 and about 100. In general, the EO groups are hydrophilic and the PO groups are lipophilic. The molecules can be simple structures as depicted above, or may have heteric or alternating EO/PO structures introduced internally or at the ends of the molecule. Preferably, the total number of ethylene oxide groups (a+c) ranges from about 24 to about 144, and the number of propylene oxide groups (b+d) ranges from about 16 to about 55. Block copolymers of the first type are available from BASF as PLURONIC® surfactants, and those of the second type as PLURONIC® R surfactants. Good results were obtained using specific block copolymer compositions containing 25 moles of EO and 20 moles of PO; 24 moles of EO and 29 moles of PO; and 26 moles of EO and 53 moles of PO.

B) Tetrafunctional block copolymers derived from the sequential addition of propylene oxide and ethylene oxide to ethylenediamine. Such compounds are also referred to as poloxamines, and are available from BASF as TETRONIC® surfactants.

C) Ethoxylated octylphenols having about 9 to about 40 moles of ethylene oxide. Such molecules may be prepared by the reaction of octylphenol with ethylene oxide. The products of this type are commonly described as alkylaryl polyether alcohols and have the following general structure:

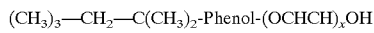

$(CH_3)_3—CH_2—C(CH_3)_2\text{-Phenol-}(OCHCH)_xOH$ wherein x represents the average number of ethylene oxide groups in the ether side chain. Such ethoxylated octylphenols are available from Union Carbide as TRITON® X-Series surfactants. Particularly preferred products of this type are those in which x ranges from about 9 to 12.

D) Ethoxylated nonylphenols having about 7 to about 40 moles of ethylene oxide, of similar structure to the octylphenols, except with a nonyl group in place of the octyl group. Particularly preferred nonylphenols have an average of about 10 to about 12 moles of ethylene oxide.

E) Linear ethoxylated alcohols having about 6 to about 18 carbon atoms and about 7 to about 24 moles of ethylene oxide, more preferably about 11 to about 15 carbon atoms and about 7 to about 12 moles of ethylene oxide.

F) Branched ethoxylated alcohols having about 6 to about 20 carbon atoms and about 6 to about 40 moles of ethylene oxide. The molecules may also include propylene oxide groups. Products of this type are available as TERGITOL® surfactants from Union Carbide.

In a preferred form, the cleaning composition has a pH of about 7 and comprises: (a) from about 50 wt. % to about 95 wt. % deionized water; (b) about 5 wt. % to about 50 wt. % water-soluble nonionic surfactants.

In another embodiment of the present invention, the cleaning composition comprises an aqueous mixture of a surfactant, preferably a nonionic surfactant, and at least one glycol ether compound of the general formula

$R^1O—(CH_2CR^3HO)_n—R^2$ wherein $R^1$ is a hydrogen atom or an alkyl group having 1 to about 5 carbon atoms, $R^2$ is an alkyl group having 1 to about 5 carbon atoms, $R^3$ is a hydrogen atom or a methyl group, and n is an integer of 2 to 4. Preferred glycol ether compounds of this formula for use in the present cleaning composition are propylene glycol alkyl ethers, particularly dipropylene glycol alkyl ethers, and more particularly dipropylene glycol n-butyl ether.

Without limiting the proportions of the surfactant and glycol ether compound, a preferred composition for use in the process of the present invention comprises an aqueous mixture containing about 95 to about 10 wt. % nonionic surfactant and about 5 to about 90 wt. % glycol ether compound, more preferably about 60 to about 40 wt. % nonionic surfactant and about 40 to about 60 wt. % glycol ether compound.

A preferred method for cleaning parts in accordance with the present invention is by immersion in a sonic bath of the cleaning composition, such as a tank equipped with sweep frequency ultrasonics. Alternatively, the parts could be immersed in a simple agitated bath or even an unagitated bath, provided the parts are sufficiently cleaned. As another alternative, a stream of cleaning solution can be directed at the surface being cleaned, preferably with sufficient force to dislodge and dissipate the soil without damaging the substrate. This technique could be particularly useful for surfaces that are difficult to immerse, such as components of manufacturing equipment.

Cleaning can be performed at room temperature or at elevated temperature, depending on factors such as the contaminant being removed, the nature of the substrate, the cleaner being used, and the type of cleaning process. One skilled in the art can determine readily whether any additional temperature adjustment is needed or desirable. Although room temperature generally is considered about 72° F. (22° C.), it is preferred that compositions for cleaning at room temperature be effective at temperatures as low as about 60° F. (16° C.) and as high as about 90° F. (32° C.). Compositions of the present invention which contain glycol ethers are particularly preferred for use in cleaning processes conducted at temperatures of about 60° F. (16° C.) to about 90° F. (32° C.).

Elevated cleaning temperatures in the range of about 110° F. (43 ° C.) to about 140° F. (60° C.) have been found suitable for cleaning many uncured epoxy adhesives and solder pastes. Compositions of the present invention which do not contain glycol ethers are particularly suitable for use at elevated temperatures of about 110° F. (43 ° C.) to about 140° F. (60° C.). Compositions containing a glycol ether component are also suitable for use at such temperatures.

The cleaning compositions of the present invention have a number of advantages associated with their use. They are environmentally attractive because they are substantially free of ozone depleting substances, low in volatile organic compounds, nonflammable and have a relatively low or neutral pH. They can be used to clean both raw solder paste and uncured surface-mount adhesives from electronic circuit boards and stencils.

While not wanting to limit the invention, we believe that the mechanism by which the present invention cleans uncured epoxy adhesives is a combination of dissolution and dispersion assisted by mechanical agitation such as ultrasonics or spraying. The resins and other soluble components of the adhesives are dissolved in the aqueous cleaning composition. Plasticizers in the adhesives may be dissolved or merely softened and dispersed by the composition. Insoluble fillers and pigments are dispersed in the solution.

EXAMPLES

Example 1

Product Preparation

The cleaning compositions of Solutions A, B, C, and D, made in accordance with the present invention, were prepared by mixing the ingredients in the proportions stated below, in weight percent:

A. 95% deionized water, 4.5% block copolymer of 25 moles of ethylene oxide (EO) and 20 moles of propylene oxide (PO), and 0.5% polyoxyalkylene glycol ether (TERGITOL® Min-Foam 2X from Union Carbide).

B. 95% deionized water, 4.9% block copolymer of 25 moles of EO and 20 moles of PO, and 0.1% octylphenol condensed with 9 moles of ethylene oxide.

C. 50% deionized water, 45% block copolymer of 25 moles of EO and 20 moles of PO, and 5% polyalkylene glycol ether.

D. 95% deionized water, 5% block copolymer of 25 moles of EO and 20 moles of PO.

Use Examples

1. Solution A was placed in a beaker and the beaker was immersed in water in a tank containing sweep frequency ultrasonics. The solution was not heated. Cleaning was done at the ambient temperature of the tank, from about 100 degrees Fahrenheit to about 120 degrees Fahrenheit (operating the ultrasonics gradually raises the temperature of the composition). About 0.2 gram of epoxy consisting of both small dots (representative of a "misprint") and a thick film of Loctite CHIPBONDER® 3611 or Ciba EPIBOND® 7275 surface-mount adhesives, and 0.5 gram of Alpha UP-78 no-clean solder paste were placed on an epoxy laminate printed circuit board. The board was immersed in solution A, and the time for complete removal of the epoxy and paste was recorded. The adhesive dots were completely removed in 5 minutes, the solder paste was completely removed in 1.5 minutes, and the thick adhesive films were removed in about 30 minutes.

2. The same test as Use Example 1 was done with SMART SONIC® 440R, a water-based alkaline detergent. Following the manufacturer's use recommendations, the product was diluted to 5% active with deionized water (50% by weight). Loctite 3611 and Ciba EPIBOND® 7275 adhesives and Alpha RMA 390DH4 no-clean solder paste were tested. The solder paste was removed within 2 minutes. The adhesives were not removed even after 1 hour, at which point the test was discontinued.

3. Solution B was tested in a machine specifically designed to clean stencils and misprints. The machine consists of a heated tank containing 40 kHz sweep frequency ultrasonics and a deionized water spray rinse. There is a rack and basket attached to an automated lift, which can be lowered into and raised out of the cleaning solution. In the cleaning solution, residues are removed by the solution with the aid of mechanical agitation caused by ultrasonic cavitation. As the lift rises after cleaning, the parts are rinsed with a DI water spray. Drying is done manually with air from a spray nozzle on the machine. Alpha AP4000, Alpha RMA390DH4 no-clean, Alpha RMA376EH, and Alpha UP78 no-clean solder pastes, and Loctite 3611 surface-mount adhesive were applied to stainless steel coupons representative of stencils. A thick film of about 1 gram of each paste, and about 0.2 gram consisting of small dots representative of a "misprint" and a thick film of adhesive were applied. The coupons were placed on the automated carrier in the machine, and all of the pastes and adhesives were removed completely from the coupons using the following cleaning cycles:
    a. 6 minutes at 120° F.,
    b. 4 minutes at 120° F.,
    c. 3 minutes at 140° F., or
    d. 2.5 minutes at 130° F.

4. Solution A was tested in the same machine as in Use Example 3. Alpha AP4000, Alpha RMA390DH4 no-clean, Alpha RMA376EH, and Alpha UP78 no-clean solder pastes, and Loctite 3611 surface-mount adhesive were applied to stainless steel coupons representative of stencils. In addition, Alpha LR737 no-clean solder paste and Loctite 3616, Ciba EPIBOND® 7275, and Heraeus PD955PR surface-mount adhesives were applied to a circuit board. A thick film of about 1 gram of each paste, and about 0.2 gram consisting of small dots representative of a "misprint" and a thick film of adhesive were applied. The coupons and circuit board were placed on the automated carrier in the machine, and all of the pastes were completely removed from the coupons using the following cleaning cycles:
    a. 3 minutes at 120° F.,
    b. 3 minutes at 130° F., or
    c. 3 minutes at 140° F.

All of the adhesives were completely removed using the following cleaning cycles:
    a. 5 minutes at 140° F.,
    b. 6 minutes at 140° F.,
    c. 6 minutes at 130° F., or
    d. 6 minutes at 120° F.

5. Solution C was diluted to 10% in deionized water and tested in exactly the same manner in the same equipment as Solution B in Use Example 4. Cleaning results were identical.

6. Solution D was tested in the same machine described in Use Example 3. Solder pastes (Alpha RMA390DH4 no-clean, Alpha AP4000, Alpha UP78 no-clean, and Alpha RMA376EH) and Loctite 3611 SMD adhesive were applied in small dots and a thin film onto metal coupons. Alpha LR737 no-clean solder paste and Loctite 3616, Ciba EPIBOND® 7275, and Heraeus PD955PR surface-mount adhesives were applied to a circuit board. A thick film of about 1 gram of each paste, and about 0.2 gram consisting of small dots representative of a "misprint" and a thick film of adhesive were applied. The coupons and circuit board were placed on the automated carrier in the machine, and all of the pastes were removed completely from the coupons using the following cleaning cycles:
    a. 6 minutes at 130° F.,
    b. 6 minutes at 117° F., or
    c. 3 minutes at 140° F.

All of the adhesives were completely removed using the following cleaning cycles:
    a. 6 minutes at 130° F., or
    b. 6 minutes at 140° F.

EXAMPLE II

The following are examples of cleaning compositions comprising mixtures of nonionic surfactants and a glycol ether compound.

Composition E comprised 46 wt. % of the same nonionic surfactant used in Compositions A–D (Pluronic L44, identified by the manufacturer as a block copolymer averaging about 25 moles of ethylene oxide (EO) and 20 moles of propylene oxide (PO)), 41 wt. % dipropylene glycol n-butyl ether, 9.5 wt. % Ross Chem Foam Blast 397C (proprietary defoamer), and 3.5 wt. % deionized water.

Other organic or silicone-based defoamers, preferably organic, may be used in place of the proprietary commercial defoamer used in this example. The defoamers are added to reduce foaming, which is of particular importance when the composition is applied by spraying methods which otherwise can cause undesirable foaming in cleaning compositions.

Composition E is preferably used after dilution to about 10 to about 25 volume percent in water.

A first set of tests were conducted in which Composition E was tested using an Austin American Technologies X-A30 spray-in-air machine. Different soils were applied to a stencil and cleaned in the X-A30 machine at a specified temperature for a specified length of time. The temperature range was 75–130° F., and the time range was 3–10 minutes. The soils tested were Heraeus PD955PY, Heraeus PD944 #3, Loctite 3616, and Alpha UP78. Composition E was diluted to 10% in tap water.

The minimum requirements for complete removal of the soils listed above was at a temperature of 110° F. for 5 minutes. At temperatures of 115° F. or higher, a wash time of 3 minutes was found to be sufficient. Below 110° F., a cleaning time of 10 minutes was tested and found to be insufficient. The cleaning composition was able to maintain a pressure of greater than 30 psi in the machine. Most tests yielded sustainable pressures near 35 psi while the pressure never fell below 30 psi. The foam in the reservoir was clearly unstable while not even covering the entire air/liquid interface in the reservoir. Thus, Composition E cleans both solder pastes and adhesives in Austin American Technologies' X-A30 machine with a temperature of 11° F. and a cleaning time of 5 minutes.

A second set of tests were conducted to compare Composition E with a reference composition comprising just organic solvent and water. The reference composition was 65% tripropylene glycol monomethyl ether and 35% water. All tests were performed in an Austin American Technologies X-A30 spray-in-air machine. The reference composition was further diluted to 85% in tap water, and the Composition E was diluted to 16% in tap water. Tests were conducted using Indium SMQ92 no-clean solder paste and Loctite 3609 epoxy surface mount adhesive.

Tests were conducted using fresh paste and adhesive, and pastes and adhesives aged for different times up to 20 hours. Cleaning temperatures were between about 101° F. and 135° F. Both Composition E and the reference composition were effective for removing the test soils. Foaming was not a problem for either test cleaning composition. These tests demonstrated that Composition E was as effective as an ororganic solvent cleaner for cleaning solder pastes and surface mount adhesives using a spray-in-air machine.

Composition F comprised 50 wt. % of Pluronic L64 block copolymer nonionic surfactant (identified by the manufacturer as a block copolymer averaging about 26 moles of ethylene oxide (EO) and 31 moles of propylene oxide (PO), 45 wt. % dipropylene glycol n-butyl ether, and 5 wt. % deionized water.

Composition F may be used in any cleaning method as discussed above, but is preferred for use in ultrasonic cleaning processes, and is particularly suitable for use in cleaning at temperatures of about 70 to about 80° F.

Tests were conducted using the following commercially available solder pastes and SMD epoxy adhesives, which were applied to stencils with fine pitch apertures:

| Pastes | SMD Adhesives |
| --- | --- |
| Alpha UP78 | Epibond 7275 Red |
| Alpha UP78-OSP | Epibond 7275 Yellow |
| Alpha RMA 390DH4 | Heraeus PD955PR |
| Alpha RMA 376EH | Heraeus PD955PY |
| | Loctite 3612 |

Five gallons of either Composition F or Composition C were poured into a BSC-944 ultrasonic cleaning machine, and water was added to make a total volume of about 50 gallons. The ultrasonics (40KHz, sweep frequency) were turned on and allowed to degas for 17 minutes. Stencils were racked in the carrier and cleaned for various amounts of time until no residue was observed. Test conditions for each product are summarized below.

| | Composition F (at 10%) | Composition C (at 10%) |
| --- | --- | --- |
| Cleaning Temperature | Machine ambient (73°–93° F.) | Machine ambient (73° F.) or heated (120° F.) |
| Rinse time | 15 seconds | 15 seconds |
| Rinse flow rate | 2.5 gpm | 2.5 gpm |

Test Results

In all cases, Composition F cleaned more quickly and at lower temperatures than Composition C. The average cleaning times for each soil are summarized in the following table.

| | Average Time to Clean (minutes) | | |
| --- | --- | --- | --- |
| Soil | Composition F Unheated | Composition C Unheated | Composition C at 120° F. |
| UP78 | 2 | 10 | 4 |
| UP780SP | Not tested | Not tested | 6 |
| RMA390DH4 | 4 | Not tested | 4 |
| RMA376EH | 4 | Not tested | 10 |
| Epibond 7275 red | 4 | >10* | 4 |
| Epibond 7275 yell. | 4 | Not tested | Not tested |
| Heraeus PD955PR | 5 | Not tested | >10* |
| Heraeus PD955PY | 4 | Not tested | 10 |
| Loctite 3612 | 5 | Not tested | >10* |

*Test terminated after 10 minutes. Soil not completely removed.

What is claimed is:

1. A cleaning process comprising contacting a substrate having thereon a water-curable epoxy adhesive with an aqueous cleaning composition having a pH of below about 10 and a volatile organic compound content (VOC) of less than about 50 g/L and comprising: (A) about 5 to about 50 wt. % of a water soluble nonionic surfactant which inhibits said adhesive from curing and which is effective in removing said adhesive from said substrate; and (B) about 50 to about 95 wt. % of water; wherein said contact is maintained for a period of time sufficient to clean said adhesive from said substrate.

2. A process according to claim 1, wherein said surfactant is selected from the group consisting of one or more of the following:
   (A) a block copolymer of ethylene oxide and propylene oxide having about 24 to about 144 moles of ethylene oxide and about 16 to about 55 moles of propylene oxide;
   (B) a polyoxamine;
   (C) an ethoxylated octylphenol having about 9 to about 40 moles of ethylene oxide;
   (D) an ethoxylated nonylphenol having about 7 to about 40 moles of ethylene oxide;
   (E) a linear ethoxylated alcohol having about 6 to about 18 carbon atoms and about 7 to about 24 moles of ethylene oxide; and
   (F) a branched ethoxylated alcohol having about 6 to about 20 carbon atoms and about 6 to about 40 moles of ethylene oxide.

3. The process according to claim 2 wherein the surfactant comprises said block copolymer.

4. The process according to claim 1 wherein the surfactant comprises dipropylene glycol n-butyl ether.

5. The process according to claim 1 wherein the surfactant comprises tripropylene glycol monomethyl ether.

6. The process according to claim 1 wherein said substrate is the surface of electronic parts or equipment used in the manufacture of electronic parts.

7. The process according to claim 2 wherein said substrate is the surface of electronic parts or equipment used in the manufacture of electronic parts.

8. The process according to claim 3 wherein said substrate is the surface of electronic parts or equipment used in the manufacture of electronic parts.

9. The process according to claim 4 wherein said substrate is the surface of electronic parts or equipment used in the manufacture of electronic parts.

10. The process according to claim 5 wherein said substrate is the surface of electronic parts or equipment used in the manufacture of electronic parts.

11. The process according to claim 3 wherein the nonionic surfactant comprises said ethoxylated nonylphenol having about 10 to about 12 moles of ethylene oxide.

12. The process according to claim 3 wherein the nonionic surfactant comprises said ethoxylated octylphenol having about 9 to about 12 moles of ethylene oxide.

13. The process according to claim 3 wherein the nonionic surfactant comprises said linear ethoxylated alcohol with 11 to 15 carbon atoms and 7 to 12 moles of ethylene oxide.

14. The process according to claim 11 wherein said residue comprises an epoxy-based adhesive.

15. The process according to claim 12 wherein said residue comprises an epoxy-based adhesive.

16. The process according to claim 13 wherein said residue comprises an epoxy-based adhesive.

17. A process for cleaning a substrate having thereon a residue which comprises a water-curable organic material comprising contacting said substrate with an aqueous cleaning composition which inhibits said material from curing, which is effective in removing said residue from the substrate, and which comprises water and a nonionic surfactant which is at least partially water soluble and which is selected from the group consisting of:

(a) an ethoxylated nonylphenol having about 10 to about 12 moles of ethylene oxide;

(b) an ethoxylated octylphenol having about 9 to about 12 moles of ethylene oxide; and (c) a linear ethoxylated alcohol with 11 to 15 carbon atoms and 7 to 12 moles of ethylene oxide.

18. The process according to claim 17 wherein said residue comprises an epoxy-based adhesive.

* * * * *